(12) United States Patent
Downes

(10) Patent No.: US 6,222,277 B1
(45) Date of Patent: Apr. 24, 2001

(54) NON-COLLAPSING INTERCONNECTION FOR SEMICONDUCTOR DEVICES

(75) Inventor: Stuart Downes, Milford, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/338,810

(22) Filed: Jun. 23, 1999

(51) Int. Cl.$^7$ .................................................. B23K 31/02

(52) U.S. Cl. ........................... 257/778; 257/738; 438/616

(58) Field of Search ..................... 228/180.22; 257/737, 257/738; 438/613, 614, 615, 616, 617

(56) References Cited

U.S. PATENT DOCUMENTS

| | | |
|---|---|---|
| 4,581,680 | 4/1986 | Garner . |
| 4,604,644 | * 8/1986 | Beckham et al. ..................... 257/737 |
| 4,766,670 | * 8/1988 | Gazdik et al. ........................ 29/830 |
| 4,807,021 | 2/1989 | Okumura . |
| 4,965,700 | * 10/1990 | Mcbride ................................ 361/751 |
| 5,056,215 | * 10/1991 | Blanton ................................. 29/840 |
| 5,103,290 | * 4/1992 | Temple et al. ....................... 357/74 |
| 5,220,200 | 6/1993 | Blanton . |
| 5,477,933 | * 12/1995 | Nguyen ................................ 174/262 |
| 5,716,222 | 2/1998 | Murphy . |
| 5,796,590 | * 8/1998 | Klein .................................... 361/774 |
| 5,805,427 | * 8/1998 | Hoffman .............................. 361/770 |
| 5,931,371 | * 8/1999 | Pao et al. ........................ 228/180.22 |

* cited by examiner

Primary Examiner—Timothy P. Callahan
Assistant Examiner—Hai L. Nguyen
(74) Attorney, Agent, or Firm—John M. Gunther, Esq.; Krishnendu Gupta, Esq.

(57) ABSTRACT

A semiconductor interconnect structure which includes a semiconductor substrate having a bottom surface. The printed circuit board also has a plurality of solder wettable pads disposed on the top surface of the printed circuit board. The printed circuit board and the semiconductor substrate are both comprised of material taken from the same group of materials. The interconnect structure also includes a plurality of balls formed of a first solder alloy disposed on the bottom surface of the semiconductor substrate and projecting downwardly therefrom. Each one of the plurality of balls are sized to support the weight of the semiconductor substrate. The interconnect structure also includes a plurality of solder joints formed of a second solder alloy connecting the plurality of balls to the corresponding plurality of wettable pads on the printed circuit board. The first solder alloy has a liquidus temperature greater than the second solder alloy liquidus temperature, and the second solder alloy has a liquidus temperature suitable for use with the material comprising the printed circuit board and the semiconductor substrate. The material comprising the printed circuit board and the semiconductor substrate are thermally degradable at a temperature greater than the liquidus temperature of the second solder alloy and lesser than the liquidus temperature of the first solder alloy.

11 Claims, 2 Drawing Sheets

NON-COLLAPSING INTERCONNECTION FOR SEMICONDUCTOR DEVICES

FIELD OF THE INVENTION

This invention relates to the general field of interconnection of semiconductor devices, more particularly to the interconnection of semiconductor devices to printed circuit boards without the introduction of mechanical stress from thermal cycling and such that the interconnection is non-collapsing in nature and has improved fatigue life. This invention also relates to the interconnection of a ball grid array to a printed circuit board.

BACKGROUND OF THE INVENTION

Semiconductor devices, such as, integrated circuits, chips, ball grid arrays, multi-chip modules and microelectronic packages are connected to one another via printed circuit boards. The term printed circuit board is used here in a generic sense and include all types of boards that hold chips and other electronic components. Typically, a printed circuit board is made of reinforced fiberglass or plastic and interconnects components via copper pathways. The main printed circuit board in a system is called a system board or motherboard, while smaller ones that plug into the slots in the main board are called boards or cards.

A semiconductor device generally has a planar surface with several contacts or leads arranged in a pattern. A printed circuit board generally has solder wettable contact pads having some solder deposited thereon and arranged in patterns that correspond to the pattern of contacts on the semiconductor devices to be mounted on the board. Typically, a semiconductor device is mounted on a printed circuit board by placing the device contact points on corresponding board contact pads and then subjecting the semiconductor device and printed circuit board combination to a thermal cycling process. The thermal cycling process first heats the solder to its liquidus temperature thereby causing the solder to flow, and then cools the solder to its solidus temperature thereby causing it to solidify so that a solder interconnection joint is formed and the device is attached to the board.

Generally, the semiconductor device and the printed circuit board are made of different materials. For example, the semiconductor device may be a plastic resin encapsulated ball grid array or a ceramic encapsulated ball grid array, whereas the printed circuit board may be made of an epoxy resin. These materials have significantly different coefficients of thermal expansions, which means that the materials expand and contract differently when heated or cooled over the same temperature range. Accordingly, using prior art interconnection methods as described above, when a printed circuit board and a semiconductor device combination is subject to thermal cycling for solder reflow, the board and the device expand and contract at different rates. This thermal mismatch caused by the difference in coefficient of thermal expansion generates a substantial amount of mechanical stress in the device, the board and the solder interconnection formed upon completion of the thermal cycling process. The mechanical stresses introduced into the solder interconnection causes fatigue within the solder interconnection resulting often in failure of the interconnection. Additionally, the thermal mismatch caused by the difference in coefficient of thermal expansion of the materials may cause the substrate to warp.

Also, during normal operation of a semiconductor device, the flow of current through the solder joints of the interconnection causes heat to be generated. The resulting heat causes the board and the device to expand and contract at different rates due to the difference in their respective coefficients of thermal expansion. This thermal mismatch caused by the difference in coefficient of thermal expansion generates a substantial amount of mechanical stress in the solder interconnection. The mechanical stresses introduced into the solder interconnection causes fatigue within the solder interconnection resulting often in failure of the interconnection.

Additionally, semiconductor devices, such as ball grid arrays have been getting larger and heavier as more and more functionality and circuitry are built into them. During the thermal cycling process to reflow the solder, the weight of the semiconductor device often causes the solder interconnect to collapse or semi-collapse and distort. Collapsed solder interconnects pose several processing problems and also often lead to shorting of adjacent pads of the printed circuit board. Additionally, a collapsed or distorted solder interconnection joint has built in mechanical stresses that produce fatigue in the solder joint and may result in failure of the solder joint.

Prior art methods have attempted to solve the problem of solder joint collapse and a high wattage solder joint requirement by using solder alloys that are harder and are hence better able to support the weight the of a heavy semiconductor device. However, the higher liquidus temperature of such alloys cause thermal degradation of the materials of the semiconductor device and the printed circuit board which are typically unable to withstand the higher temperatures.

Accordingly, there is a need for a semiconductor device and printed circuit board interconnection that does not collapse under the weight of the semiconductor device and is not subject to built in mechanical stresses caused by coefficient of thermal expansion mismatch of the materials from which the semiconductor device and the board is formed.

SUMMARY OF THE INVENTION

It has been an object of the present invention to provide a semiconductor device and printed circuit board interconnection that has minimal built in mechanical stress.

It has been another object of the present invention to provide a semiconductor device and printed circuit board interconnection that is able to withstand the weight of the semiconductor device and that does not collapse or fatigue as a result of thermal cycling.

These objects have been achieved in accordance with one aspect of the present invention by providing a semiconductor interconnect structure which includes a semiconductor substrate having a bottom surface. The semiconductor substrate may be a chip, a ball grid array, a multi-chip module, or the like. In addition to the semiconductor substrate the interconnect structure includes a printed circuit board underlying the semiconductor substrate which has a top surface and a bottom surface. The printed circuit board also has a plurality of solder wettable pads disposed on the top surface of the printed circuit board. The printed circuit board and the semiconductor substrate are both comprised of material taken from the same group of materials. The interconnect structure also includes a plurality of balls formed of a first solder alloy disposed on the bottom surface of the semiconductor substrate and projecting downwardly therefrom. Each one of the plurality of balls are sized to support the weight of the semiconductor substrate. The interconnect structure also includes a plurality of solder joints formed of a second solder alloy connecting the plurality of balls to the corresponding plurality of wettable pads on the printed circuit board. The first solder alloy has a liquidus temperature greater than the second solder alloy liquidus temperature, and the second solder alloy has a liquidus temperature suitable for use with the material comprising the printed circuit board and the semiconductor substrate. The material comprising the printed circuit board and the semiconductor substrate are thermally degradable at a temperature greater than the liquidus temperature of the second solder alloy and lesser than the liquidus temperature of the first solder alloy.

In accordance with another aspect of the present invention, a method for forming an interconnection attaching a semiconductor device to a printed circuit board includes the steps of providing a semiconductor device and attaching a first plurality of balls formed of a first solder alloy on the bottom surface of the semiconductor device whereupon the balls project downwardly therefrom, the first plurality of balls sized to be effective to support the weight of the semiconductor device. The method also includes the step of providing a printed circuit board having a top surface and a bottom surface, the printed circuit board also having a plurality of solder wettable pads disposed on the top surface of the printed circuit board, the semiconductor device and the printed circuit comprised of material taken from the same group of materials such that the coefficient of thermal expansion for the materials comprising the semiconductor device and the printed circuit board are approximately equal. The method also includes the steps of providing a second plurality of solder balls formed of a second solder alloy, the first solder alloy having a liquidus temperature greater than the second solder alloy liquidus temperature, and then placing the second plurality of solder balls in one-to-one correspondence with the plurality of wettable pads on the printed circuit board. Aditionally, the method also includes the step of placing the semiconductor device over the printed circuit board such that the each one of the first plurality of solder balls of the semiconductor device is positioned above a corresponding one of the plurality of wettable pads on the printed circuit board. Next, the method includes the step of heating the semiconductor device, the printed circuit board, the first and second pluralities of solder balls to a temperature that is above the liquidus temperature of the first solder alloy and below the liquidus temperature of the second solder alloy, such that each of one of the second plurality of solder balls flows about the corresponding first solder ball on the corresponding wettable pad of the printed circuit board, and such that the during the heating the first plurality of solder balls remain solid to prevent collapse of the first plurality of solder balls. The method also includes the step of cooling the semiconductor device and the printed circuit board to solidify the second solder alloy and attach the semiconductor device to the printed circuit board.

In accordance with yet another aspect of the present invention, a method for forming an interconnection attaching a ball grid array to a printed circuit board includes the steps of providing a ball grid array and attaching a first plurality of balls formed of a first solder alloy on the bottom surface of the ball grid array whereupon the balls project downwardly therefrom, the first plurality of balls sized to be effective to support the weight of the ball grid array. The method according to this aspect of the present invention also includes the step of providing a printed circuit board having a top surface and a bottom surface, the printed circuit board also having a plurality of solder wettable pads disposed on the top surface of the printed circuit board, the ball grid array and the printed circuit comprised of material taken from the same group of materials such that the coefficient of thermal expansion for the materials comprising the ball grid array and the printed circuit board are approximately equal. The method according to this aspect of the present invention further includes the step of providing a second plurality of solder balls formed of a second solder alloy, the first solder alloy having a liquidus temperature greater than the second solder alloy liquidus temperature. Also, the method according to this aspect of the present invention includes the steps of placing the second plurality of solder balls in one-to-one correspondence with the plurality of wettable pads on the printed circuit board and positioning the ball grid array over the printed circuit board such that the each one of the first plurality of solder balls of the ball grid array is positioned above a corresponding one of the plurality of wettable pads on the printed circuit board. The method according to this aspect of the present invention further includes the step of heating the ball grid array, the printed circuit board, the first and second pluralities of solder balls to a temperature that is above the liquidus temperature of the first solder alloy and below the liquidus temperature of the second solder alloy, such that each of one of the second plurality of solder balls flows about the corresponding first solder ball adjacent the corresponding wettable pad of the printed circuit board, and such that the during the heating the first plurality of solder balls remain solid to prevent collapse of the first plurality of solder balls. The method according to this aspect of the present invention further includes the step of cooling the ball grid array and the printed circuit board to solidify the second solder alloy to complete attachment of the ball grid array and the printed circuit board.

BRIEF DESCRIPTION OF THE DRAWINGS

The above and further advantages of the present invention may be better understood by referring to the following description taken into conjunction with the accompanying drawings in which.

DETAILED DESCRIPTION OF THE PREFERRED EMBODIMENT

Figure 1:
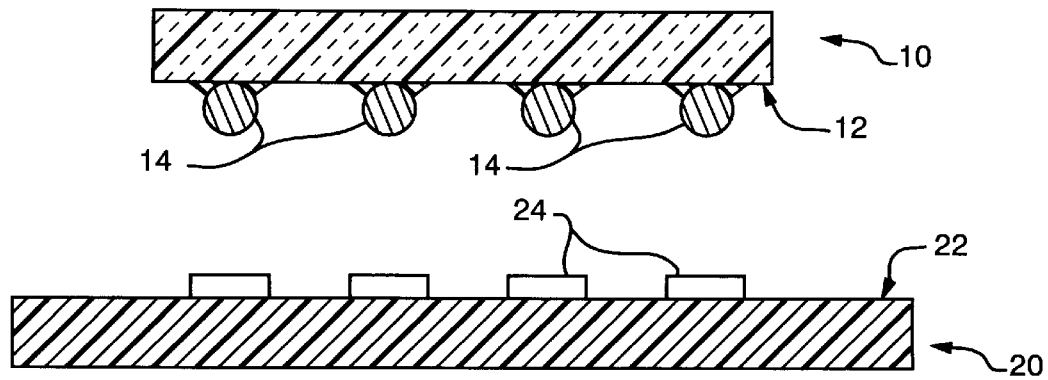
FIG. 1 is a cross-sectional view of a semiconductor device and a printed circuit board shown individually prior to attachment and formation of interconnect structure in accordance with the principles of the present invention.

Referring now to FIG. 1, a cross-sectional view of a semiconductor device or semiconductor substrate 10 and a printed circuit board 20 is shown individually prior to attachment and formation of interconnect structure in accordance with the principles of the present invention. The semiconductor device 10 may be any of a well known type of semiconductor device. For example semiconductor device 10 may be an integrated circuit, a chip, a plastic ball grid array, a ceramic ball grid array, a multi-chip module, or a microelectronic package. Referring again to FIG. 1, the semiconductor device 10 is shown having a bottom surface 12. In preparation for attachment to printed circuit board 20 and the formation of an interconnect structure in accordance with the principles of the present invention a plurality of balls 14 are bonded on the bottom surface 12 of the semiconductor device.

As shown in FIG. 1, the plurality of balls 14 are disposed on the bottom surface 12 of the semiconductor device 10 so as to project downwardly therefrom. The plurality of balls 14 are comprised of a solder alloy. Solder alloys that have yielded good results have included tin-lead solder alloys. The preferred alloy to use for the plurality of balls 14 is one comprising 90% tin and 10% lead. The liquidus temperature for this alloy is 302° C. It should be noted that the alloy composition for the alloy comprising the plurality of balls 14 as presented here is for the purpose of illustrating the invention and not for the purpose of limiting it. For example, the alloy comprising the plurality of balls 14 could contain from 85 to 95% tin and 15 to 5% lead. Additionally, an alloy may be doped with low amounts of other metals to adjust the liquidus temperature, and other mechanical and metallurgical properties of the alloy. Other alloy systems could be used effectively as well and produce results in accordance with the principles of the present invention. Some examples of suitable alloy systems are listed in Table A below. The alloys of Table A may be suitably doped to adjust the liquidus temperature, and other mechanical and metallurgical properties. The alloy groups of Table A are listed in an ascending order of liquidus temperature for the alloy group when moving left to right and top to bottom across the table.

TABLE A

| Lead Tin (247° C. liquidus); | Bismuth Tin | Lead Antimony |
|---|---|---|
| Lead Indium | Gold Tin | Tin Silver |
| Lead Indium Gold | Lead Gold | Cadmium Gold (395° C. liquidus) |

As shown in FIG. 1, the plurality of balls 14 may be attached or bonded to the semiconductor device 10 using one of several known bonding techniques, including the use of a low temperature solder alloy. The preferred alloy to use for attaching the plurality of balls 14 on the bottom 12 of the semiconductor device 10 is one comprising 63% tin and 37% lead. The liquidus temperature for this alloy is 183° C., which is lower than the liquidus temperature of the alloy comprising the plurality of balls 14. It should be noted that the alloy composition for the bonding alloy as presented here is for the purpose of illustrating the invention and not for the purpose of limiting it. Additionally, an alloy may be doped with low amounts of other metals to adjust the liquidus temperature, and other mechanical and metallurgical properties of the alloy. Accordingly, other alloy systems could be used effectively as well and produce results in accordance with the principles of the present invention. Other examples of suitable alloy systems are specified in Table B below.

TABLE B

| Bismuth Lead Tin (100° C. liquidus) | Bismuth Lead Tin Cadmium | Indium Tin | Bismuth Lead | Indium Bismuth Lead Cadmium |
|---|---|---|---|---|
| Bismuth Tin | Indium Silver | Indium Lead | Tin Indium | Bismuth Indium |
| Lead Tin Bismuth | Indium | Lead Bismuth | Tin Lead Bismuth | Tin Bismuth |
| Tin Lead | Tin Lead Silver | Lead Indium | Tin Silver | Tin Silver Antimony (240° C. liquidus) |

As shown in FIG. 1, the balls 14 are sized to provide sufficient solder volume for an electrically reliable interconnect. The balls 14 are also sized to have the strength to withstand the weight of the semiconductor device 10 being supported without collapsing, and to maintain the desired spacing between the semiconductor device 10 and printed circuit board 20. Accordingly, the balls 14 are sized based on the size and weight of the semiconductor device, the dimensions of the printed circuit board pads, the desired ball density of the semiconductor device, and the desired separation between pads of the semiconductor device.

Also as shown in FIG. 1, the printed circuit board 20 may be any of a well known type of circuit board. For example, printed circuit board 20 as used here in a generic sense includes all types of boards that hold semiconductor devices, chips and other electronic components. Typically, a printed circuit board is made of reinforced fiberglass or plastic and interconnects components via copper pathways. As shown, printed circuit board 20 is comprised of FR4 which is a reinforced fiberglass laminate. However, the printed circuit board 20 may also be comprised of plastic, BT, ceramic, enamelized steel. It should be noted that the material comprising the printed circuit board 20 as presented here is for the purpose of illustrating the invention and not for the purpose of limiting it.

Also as shown in FIG. 1, the printed circuit board 20 includes a top surface 22 and has a plurality of pads 24. The pads 24 are electrically connected via the internal pathways of the printed circuit board 20. The pads 24 may be coated with copper and is solder wettable. A deposit of solder alloy may also be placed on each pad surface to assist with the electrical bonding of devices to be attached to the pads. This solder deposit may be comprised of a low temperature solder alloy. The preferred alloy to use is one comprising 63% tin and 37% lead. The liquidus temperature for this alloy is 183° C., which is lower than the liquidus temperature of the alloy comprising the plurality of balls 14. It should be noted that the alloy composition for the bonding alloy as presented here is for the purpose of illustrating the invention and not for the purpose of limiting it. Accordingly, other alloy systems could be used effectively as well and produce results in accordance with the principles of the present invention. Other examples of suitable alloy systems are set forth in Table B above.

Referring again to FIG. 1, in preparation for attaching the semiconductor device 10 to printed circuit board 20, the semiconductor device 10 and the printed wiring board 20 are arranged in the assembly shown in FIG. 1 with the semiconductor device 10 positioned over the printed circuit board 20 such that each one of the plurality of solder balls 14 is positioned above a corresponding one of the plurality of solder wettable pads 24.

During, the formation of the interconnect in accordance with the principles of the invention, after the semiconductor device 10 and the printed circuit board 20 have been positioned as set forth above, the assembly is heated to a temperature that is below the liquidus temperature of the solder alloy comprising the plurality of balls 14, but is greater than the liquidus temperature of the low temperature solder alloy used to attach the balls 14 to the semiconductor device and the solder alloy which is deposited on each pad 24 of the printed circuit board 20. For the preferred low temperature solder alloy composition disclosed above, the temperature to which the assembly may be heated is 240° C., which is above the liquidus temperature of the low temperature solder alloy which is 183° C. but below the liquidus temperature of the solder alloy comprising the plurality of balls 14, which for the preferred solder composition disclosed above is 302° C.

Upon heating the printed circuit board 20 and semiconductor device 10 assembly to a temperature greater than the liquidus temperature of the low temperature solder alloy, the low temperature solder alloy liquifies or melts and wets the pads 24 causing the liquid solder to flow on the pads 24 around the solder balls 14. However, the solder balls 14 remain solid during the heating process because the liquidus temperature of the solder alloy comprising the balls 14 is never reached.

After, the assembly has been heated and the low temperature solder alloy has wetted the pads 24 and flowed around each solder ball 14, the assembly comprised of the semiconductor device 10 and the printed circuit board 20 is cooled to a temperature that is below the liquidus temperature of the low solder alloy causing the molten solder alloy to solidify and complete the attachment and interconnection of the semiconductor device 10 and printed wiring board 20. A cross-sectional view of the semiconductor device 10 and the printed circuit board 20 of FIG. 1 and an interconnect structure in accordance with the principles of the present invention is shown in FIG. 2.

Figure 2:
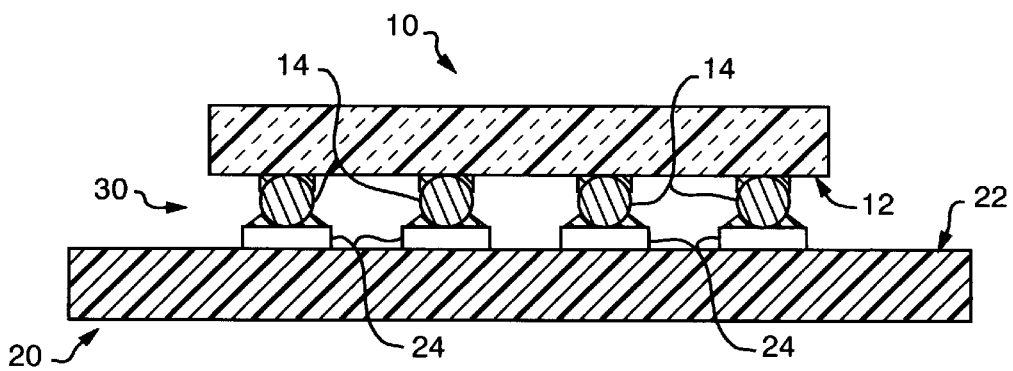
FIG. 2 is a cross-sectional view of the semiconductor device and the printed circuit board of FIG. 1 and an interconnect structure in accordance with the principles of the present invention.

Also, as shown in FIG. 2, in accordance with the principles of the invention, the plurality of balls 14 do not melt during the heating step and therefore generally maintain their shape without collapsing from the weight of the semiconductor device during the interconnect formation process. Also, because the solder balls 14 do not liquify during the interconnect formation process, there are minimal built-in stresses within the interconnect, in accordance with the principles of the present invention. Therefore, the present invention provides an interconnect structure that resists fatigue and breakage during solder reflow and the associated thermal cycle.

Further, in accordance with the principles of the invention, good results were also attained by selecting a printed circuit board 20 and a semiconductor device 10 comprised of material taken from the same group of materials so that there was minimal or no mismatch in the coefficients of thermal expansion of the materials. Accordingly, by selecting the semiconductor device 10 and printed circuit board 20 to be comprised of material taken from the same group of materials, the thermal mismatch caused by the difference in coefficient of thermal expansion which generates a substantial amount of mechanical stress in the device, the board and the solder interconnection formed upon completion of the thermal cycling process is eliminated. Therefore, in accordance with the principles of the present invention, the mechanical stresses introduced into the solder interconnection are minimal thereby resulting in substantially reduced fatigue within the solder interconnection.

Figure 3:
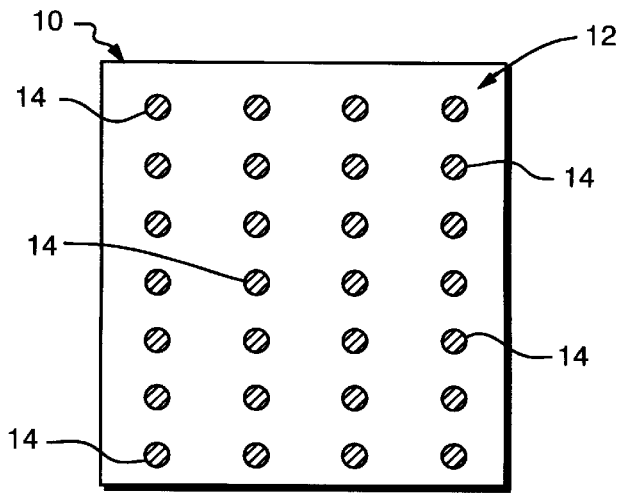
FIG. 3 is a plan view of a semiconductor device such as that of FIG. 1 in accordance with a preferred embodiment of the present invention.

Referring now to FIG. 3, a plan view of a semiconductor device 10 such as that of FIG. 1 in accordance with a preferred embodiment of the present invention, is shown. In the preferred embodiment, each one of the balls 14 attached to the bottom surface 12 of semiconductor device 10 are comprised of 90% tin and 10% lead or one of the solder alloys disclosed above in Table A.

Figure 4:
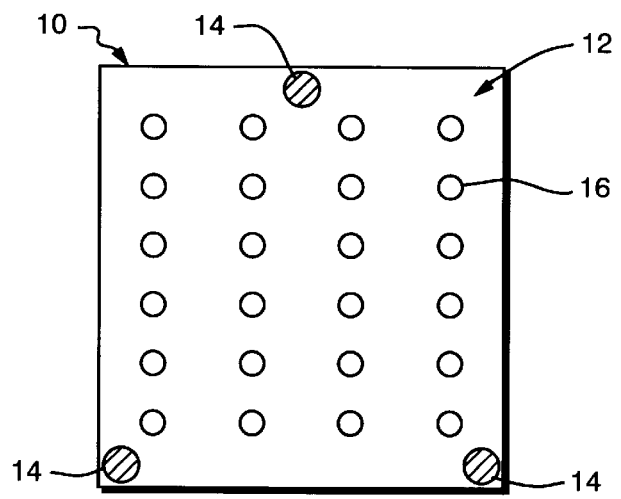
FIG. 4 is a plan view of a semiconductor device such as that of FIG. 1 in accordance with another embodiment of the present invention.

In an alternative embodiment of the present invention, as shown in the plan view of FIG. 4, a semiconductor device 10 is used wherein only a first plurality of balls 14 are formed of a first solder alloy similar to the solder alloy comprising balls 14 of the preferred embodiment as disclosed above and in Table A, while a second plurality of balls 16 are comprised of a low temperature solder alloy similar to those disclosed above and in Table B. The number of balls 14 comprising the first plurality of balls is selected based on the physical characteristics of the semiconductor device, such as its shape and size, so as to be effective in providing physical stability to the semiconductor device and the interconnect. In a preferred embodiment of the alternative embodiment as shown in FIG. 4, the number of first plurality of balls 14 is three, which is the number of balls most effective in providing structural stability to the semiconductor device and the interconnect. By employing three balls 14 that are comprised of the solder alloy having a higher liquidus temperature, the interconnection attains structural stability while ensuring that only a minimal number of balls formed of the higher liquidus temperature solder alloy is utilized. As shown in FIG. 4, the balls 14 are placed on the outer peripheral area of the bottom surface of the semiconductor device.

Figure 5:
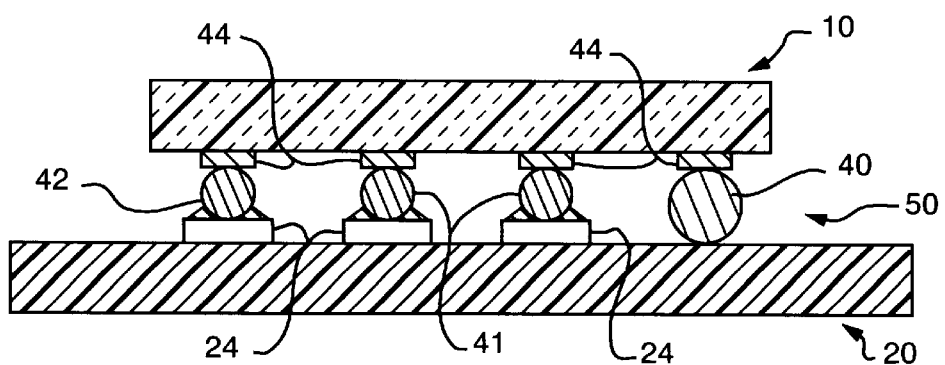
FIG. 5 is a cross-sectional view of a semiconductor device and a printed circuit board and an interconnect structure in accordance with another embodiment of the present invention.
Figure 6:
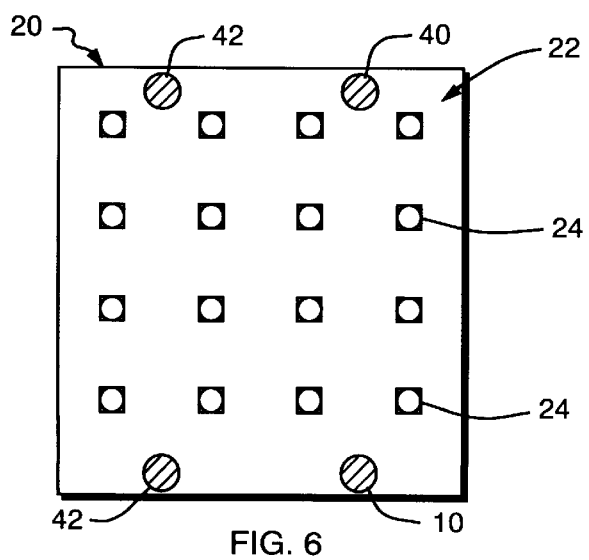
FIG. 6 is a plan view of a printed circuit board such as that of FIG. 5 in accordance with the embodiment of FIG. 5.

In another alternative embodiment of the present invention, as shown in FIGS. 5 and 6, a printed circuit board 20 is shown having a plurality of solder wettable pads 24. In accordance with the principles of the present invention, as shown in FIGS. 5 and 6, the printed circuit board includes a plurality of solder balls 42 attached thereon and projecting upwardly therefrom. The plurality of balls 42 are comprised of a solder alloy. The solder alloys that have yielded good results have included tin-lead solder alloys. The preferred alloy to use for the plurality of balls 42 is one comprising 90% tin and 10% lead. The liquidus temperature for this alloy is 302° C. It should be noted that the alloy composition for the alloy comprising the plurality of balls 42 as presented here is for the purpose of illustrating the invention and not for the purpose of limiting it. For example, the alloy comprising the plurality of balls 42 could contain from 85 to 95% tin and 15 to 5% lead. Other alloy systems could be used effectively as well and produce results in accordance with the principles of the present invention. Some examples of suitable alloy systems are specified in Table A above.

As shown in FIG. 5, the plurality of balls 42 may be attached or bonded to the printed circuit board 20 using one of several known bonding techniques, including the use of a low temperature solder alloy as disclosed above. As shown in FIG. 5, the balls 42 are sized to withstand the weight of the semiconductor device 10 being supported without collapsing while maintaining the desired spacing between the semiconductor device 10 and printed circuit board 20.

Referring again to FIG. 5, a semiconductor device 10 is shown including a plurality of balls 41 and 40 that are bonded on the bottom surface 12. As shown in FIG. 5, the plurality of balls 40, 41 are disposed on the bottom surface 12 of the semiconductor device 10 so as to project downwardly therefrom. The plurality of balls 41 are comprised of a low temperature solder alloy. The solder alloys that have yielded good results have included tin-lead solder alloys.

The preferred alloy to use for the plurality of balls 41 is one comprising 63% tin and 37% lead. The liquidus temperature for this alloy is 183° C. Some examples of suitable alloy systems are specified in Table B above.

The preferred alloy to use for the plurality of balls 40 is one comprising 90% tin and 10% lead. The liquidus temperature for this alloy is 302° C. It should be noted that the alloy composition for the alloy comprising the plurality of balls 40 as presented here is for the purpose of illustrating the invention and not for the purpose of limiting it. For example, the alloy comprising the plurality of balls 40 could contain from 85 to 95% tin and 15 to 5% lead. Other alloy systems could be used effectively as well and produce results in accordance with the principles of the present invention. Some examples of suitable alloy systems are specified in Table A above.

As shown in FIG. 5, the plurality of balls 40, 41 may be attached or bonded to the semiconductor device 10 using one of several known bonding techniques, including the use of a low temperature solder alloy such as those listed in Table B above.

In accordance with the principles of the present invention, shown in FIG. 5 the semiconductor device 10 also includes pads 44. The pads 44 are disposed on the bottom surface of the device 10 and may be copper coated pads. During the formation of the interconnect, the semiconductor device 10 is placed over the printed circuit board 20 such that the plurality of balls 42 are each positioned under a corresponding pad 44 of the semiconductor device 10, and the plurality of balls 41 are positioned over the corresponding pads 24. As shown in FIG. 5, the balls 42 are in contact with the pads 44 but are not attached to the pads 44. Further, as shown, the balls 40 are in contact with the substrate comprising the printed circuit board 20.

During, the formation of the interconnect in accordance with the principles of the invention, after the semiconductor device 10 and the printed circuit board 20 have been positioned as set forth above, the assembly is heated to a temperature that is greater than the liquidus temperature of the low temperature solder alloy used to attach the balls 41 to the semiconductor device and the solder alloy which is deposited on each pad 24 of the printed circuit board 20. For the preferred low temperature solder alloy composition disclosed above, the temperature to which the assembly is heated is above the liquidus temperature of the low temperature solder alloy which is 183° C. However, the temperature to which the assembly is heated is below the liquidus temperature of the solder alloy comprising the plurality of balls 40, 42 which for the preferred solder composition disclosed above is 302° C.

Upon heating the printed circuit board 20 and semiconductor device 10 assembly to a temperature greater than the liquidus temperature of the low temperature solder alloy, the low temperature solder alloy liquifies or melts and wets the pads 24 causing the liquid solder to flow on the pads 24 around the solder balls 41. However, the solder balls 40, 42 remain solid during the heating process because the liquidus temperature of the solder alloy comprising the balls 40, 42 is never reached.

After, the assembly has been heated and the low temperature solder alloy has wetted the pads 24 and flowed around each solder ball 41, the assembly comprised of the semiconductor device 10 and the printed circuit board 20 is cooled to a temperature that is below the liquidus temperature of the low solder alloy causing the molten solder alloy to solidify and complete the attachment and interconnection of the semiconductor device 10 and printed wiring board 20.

Further, in accordance with the principles of the alternative embodiment of the invention as shown in FIG. 5, the semiconductor device and the printed circuit board may made of different materials. For example, the semiconductor device may be a plastic resin encapsulated ball grid array or a ceramic encapsulated ball grid array, whereas the printed circuit board may be made of an epoxy resin. These materials have significantly different coefficients of thermal expansions, which means that the materials expand and contract differently when heated or cooled over the same temperature range. Accordingly, when the printed circuit board and the semiconductor device combination is subject to thermal cycling for solder reflow, the board and the device expand and contract at different rates. In accordance with the applicants invention, the unequal expansion and contraction of the printed circuit board 20 and semiconductor device 10 is accommodated by the pad 44 sliding over ball 42 and by the ball 40 sliding over the substrate of the printed circuit board 20 thereby allowing the uneven expansion or contraction to be absorbed without inducing mechanical stresses in the solder joints 41.

Further, as shown in FIG. 5, in accordance with the principles of the invention, the plurality of balls 40, 42 do not melt during the heating step and therefore maintain their shape without collapsing from the weight of the semiconductor device during the interconnect formation process. Referring now to FIG. 6, a plan view of the printed circuit board shows that the balls 40, 42 may be placed outside the area occupied by the pads 24 so that the balls 40, 42 support the semiconductor device 10 along its edges. By way of example only, the interconnect structure 50 of FIG. 5, has been shown to include balls 40, 41, 42. The interconnect structure, according to an alternative embodiment may comprise balls 40 and 41 or balls 40 and 42.

Having described a preferred and alternative embodiments of the present invention, it will now become apparent to those of skill in the art that other embodiments incorporating its concepts may be provided. It is felt therefore that this invention should not be limited to the disclosed embodiments but rather should be limited only by the spirit and scope of the appended claims.

What is claimed is:

1. A method for forming an interconnection attaching a semiconductor device to a printed circuit board comprising:

providing a semiconductor device;

attaching a first plurality of balls formed of a first solder alloy on the bottom surface of the semiconductor device whereupon the balls project downwardly from the bottom surface, the first plurality of balls sized to be effective to support the weight of the semiconductor device;

attaching a second plurality of balls formed of a second solder alloy on the bottom surface of the semiconductor device whereupon the balls project downwardly from the bottom surface, the second solder alloy having a liquidus temperature lower than the first solder alloy liquidus temperature;

providing a printed circuit board having a top surface and a bottom surface, the printed circuit board also having a plurality of solder wettable pads disposed on the top surface of the printed circuit board, the semiconductor device and the printed circuit comprised of material taken from the same group of materials such that the coefficient of thermal expansion for the materials comprising the semiconductor device and the printed circuit board are approximately equal;

placing the semiconductor device over the printed circuit board such that the each one of the first and second plurality of solder balls of the semiconductor device is positioned above a corresponding one of the plurality of wettable pads on the printed circuit board;

heating the semiconductor device, the printed circuit board, the first and second pluralities of solder balls to a temperature that is above the liquidus temperature of the first solder alloy and below the liquidus temperature of the second solder alloy, such that each of one of the second plurality of solder balls flows on the corresponding wettable pad of the printed circuit board, and such that the during the heating the first plurality of solder balls remain solid to prevent collapse of the first plurality of solder balls; and cooling the ball grid array and the printed circuit board to solidify the second solder alloy to complete attachment of the semiconductor device and the printed circuit board.

2. The method of claim 1 wherein the first solder alloy comprises an alloy of 10% lead approximately and 90% tin approximately and the second solder alloy comprises an alloy of from 37% lead approximately and from 63% tin approximately.

3. The method of claim 1 wherein the printed circuit board and the ball grid array are both comprised of material taken from the plastics group of materials.

4. The method of claim 1 wherein the semiconductor device is a ball grid array.

5. A method for forming an interconnection attaching a ball grid array to a printed circuit board comprising:

providing a ball grid array;

attaching a first plurality of balls formed of a first solder alloy on the bottom surface of the ball grid array whereupon the balls project downwardly therefrom, the first plurality of balls sized to be effective to support the weight of the ball grid array;

providing a printed circuit board having a top surface and a bottom surface, the printed circuit board also having a plurality of solder wettable pads disposed on the top surface of the printed circuit board, the ball grid array and the printed circuit comprised of material taken from the same group of materials such that the coefficient of thermal expansion for the materials comprising the ball grid array and the printed circuit board are approximately equal;

providing a second plurality of solder balls formed of a second solder alloy, the first solder alloy having a liquidus temperature greater than the second solder alloy liquidus temperature;

placing the second plurality of solder balls in one-to-one correspondence with the plurality of wettable pads on the printed circuit board;

positioning the ball grid array over the printed circuit board such that the each one of the first plurality of solder balls of the ball grid array is positioned above a corresponding one of the plurality of wettable pads on the printed circuit board;

heating the ball grid array, the printed circuit board, the first and second pluralities of solder balls to a temperature that is above the liquidus temperature of the first solder alloy and below the liquidus temperature of the second solder alloy, such that each of one of the second plurality of solder balls flows about the corresponding first solder ball adjacent the corresponding wettable pad of the printed circuit board, and such that the during the heating the first plurality of solder balls remain solid to prevent collapse of the first plurality of solder balls; and cooling the ball grid array and the printed circuit board to solidify the second solder alloy to complete attachment of the ball grid array and the printed circuit board.

6. The method of claim 5 wherein the first solder alloy comprises an alloy of 10% lead approximately and 90% tin approximately and the second solder alloy comprises an alloy of from 37% lead approximately and from 63% tin approximately.

7. The method of claim 5 wherein the printed circuit board and the ball grid array are both comprised of material taken from the plastics group of materials.

8. A method for forming an interconnection attaching a semiconductor device to a printed circuit board comprising:

providing a semiconductor device;

attaching a first plurality of balls formed of a first solder alloy on the bottom surface of the semiconductor device whereupon the balls project downwardly therefrom, the first plurality of balls sized to be effective to support the weight of the semiconductor device;

providing a printed circuit board having a top surface and a bottom surface, the printed circuit board also having a plurality of solder wettable pads disposed on the top surface of the printed circuit board, the semiconductor device and the printed circuit comprised of material taken from the same group of materials such that the coefficient of thermal expansion for the materials comprising the semiconductor device and the printed circuit board are approximately equal;

providing a second plurality of solder balls formed of a second solder alloy, the first solder alloy having a liquidus temperature greater than the second solder alloy liquidus temperature;

placing the second plurality of solder balls in one-to-one correspondence with the plurality of wettable pads on the printed circuit board;

placing the semiconductor device over the printed circuit board such that the each one of the first plurality of solder balls of the semiconductor device is positioned above a corresponding one of the plurality of wettable pads on the printed circuit board;

heating the semiconductor device, the printed circuit board, the first and second pluralities of solder balls to a temperature that is above the liquidus temperature of the first solder alloy and below the liquidus temperature of the second solder alloy, such that each of one of the second plurality of solder balls flows about the corresponding first solder ball on the corresponding wettable pad of the printed circuit board, and such that the during the heating the first plurality of solder balls remain solid to prevent collapse of the first plurality of solder balls; and cooling the semiconductor device and the printed circuit board to solidify the second solder alloy and attach the semiconductor device to the printed circuit board.

9. The method of claim 8 wherein the first solder alloy comprises an alloy of 10% lead approximately and 90% tin approximately and the second solder alloy comprises an alloy of from 37% lead approximately and 63% tin approximately.

10. The method of claim 9 wherein the printed circuit board and the ball grid array are both comprised of material taken from the plastics group of materials.

11. The method of claim 8 wherein the semiconductor device is a ball grid array.

* * * * *